(12) United States Patent
Que et al.

(10) Patent No.: US 9,728,703 B1
(45) Date of Patent: Aug. 8, 2017

(54) OPTICALLY AND THERMALLY RESPONSIVE NANOHYBRID MATERIALS

(71) Applicants: Louisiana Tech University Research Foundation; a division of Louisiana Tech University Foundation, Inc., Ruston, LA (US); Board of Regents, The University of Texas System, Austin, TX (US)

(72) Inventors: Long Que, Ruston, LA (US); Wei Chen, Arlington, TX (US)

(73) Assignees: Louisiana Tech Research Corporation, Ruston, LA (US); Board of Regents, The University of Texas System, Austin, TX (US)

( * ) Notice: Subject to any disclaimer, the term of this patent is extended or adjusted under 35 U.S.C. 154(b) by 382 days.

(21) Appl. No.: 14/204,213

(22) Filed: Mar. 11, 2014

Related U.S. Application Data

(60) Provisional application No. 61/776,342, filed on Mar. 11, 2013.

(51) Int. Cl.
| | |
|---|---|
| *H01L 35/34* | (2006.01) |
| *H01L 35/30* | (2006.01) |
| *H01L 35/32* | (2006.01) |
| *H01L 35/10* | (2006.01) |

(52) U.S. Cl.
CPC ............. *H01L 35/32* (2013.01); *H01L 35/10* (2013.01)

(58) Field of Classification Search
CPC ......... H01L 35/22; H01L 35/32; H01L 35/10; B82Y 30/00; B82Y 40/00; Y02E 10/40

USPC .................................................. 136/205, 201
See application file for complete search history.

(56) References Cited

U.S. PATENT DOCUMENTS

| | | | | |
|---|---|---|---|---|
| 4,728,878 A | * | 3/1988 | Anthony | ........... H01L 31/02021 136/243 |
| 6,566,595 B2 | * | 5/2003 | Suzuki | ................... B82Y 20/00 136/249 |

OTHER PUBLICATIONS

Li, Xianglong et al., "Tailored Single-Walled Carbon Nanotube-CdS Nanoparticle Hybrids for Tunable Optoelectronic Devices", Dec. 30, 2009, American Chemical Society, vol. 4, No. 1, pp. 506-512.*

Wu, Yue et al., "Synthesis and Photovoltaic Application of Copper (I) Sulfide Nanocrystals", 2008, Nano Letters, vol. 8, No. 8, pp. 2551-2555.*

(Continued)

Primary Examiner — Tamir Ayad
(74) Attorney, Agent, or Firm — Jones Walker, LLP

(57) ABSTRACT

Apparatus and methods of generating electricity include using an optically and thermally responsive material comprising single-walled Carbon nanotubes and Copper sulfide nanoparticles. This material acts as a thermoelectric generator lacking rectifying effects. In some forms, the generator may generate electricity from a light source alone, a heat source alone, or a source of both light and heat. Some forms exhibit enhanced optical and thermal switching characteristics, light absorption, photocurrent and thermocurrent generation under light illumination or/and thermal radiation, providing a new route to obtain thermoelectricity without any cooling or heat-sink component. Moreover, measurements showed thin films of SWNT CuS NPs had significantly increased light absorption (up to 80%) compared to untreated SWNT thin films.

33 Claims, 19 Drawing Sheets

(56) References Cited

OTHER PUBLICATIONS

Tseng, Yi-Hsuan et al., "Optical and thermal response of single-walled carbon nanotube-copper sulfide nanoparticle hybrid nanomaterials", Oct. 22, 2012, Nanotechnology 23 (2012) 455708, pp. 1-7.*

Tseng, Y. et al., "Using Nanomaterials for Local Temperature Enhancement for Thermoelectric Microgenerators", Power MEMS, Atlanta, GA, Dec. 2-5, 2012, pp. 235-238.*

Zhu, Ting et al. "Arrays of ultrafine CuS nanoneedles supported on a CNT backbone for application in supercapacitors", Journal of Materials Chemistry, Feb. 8, 2012, 22, DOI: 10.1039/c2jm30437f, pp. 7851-7855.*

Tseng, Yi-Hsuan, et al. "Optical and thermal response of single-walled carbon nanotube? copper sulfide nanoparticle hybrid nanomaterials." Nanotechnology 23.45 (2012): 455708.

Gong, Zhongcheng, et al. "A micromachined carbon nanotube film cantilever-based energy cell." Nanotechnology 23.33 (2012): 335401.

Kotipalli, Venu, et al. "Light and thermal energy cell based on carbon nanotube films." Applied Physics Letters 97, vol. 124102 (2010).

Gong, Zhongcheng, et al. "Studies of self-reciprocating characteristic of carbon nanotube film-based cantilevers under light and thermal radiation." Journal of nanoscience and nanotechnology 12.1 (2012): 350-355.

Eder, Dominik. "Carbon nanotube—inorganic hybrids." Chemical reviews 110.3 (2010): 1348-1385.

Chen, Jian, et al. "Solution properties of single-walled carbon nanotubes." Science 282.5386 (1998): 95-98.

Zhang, Jun, et al. "Visible light photocatalytic H2-production activity of CuS/ZnS porous nanosheets based on photoinduced interfacial charge transfer." Nano Letters 11.11 (2011): 4774-4779.

Lee, Mikyung, and Kijung Yong. "Highly efficient visible light photocatalysis of novel CuS/ZnO heterostructure nanowire arrays." Nanotechnology 23.19 (2012): 194014.

Zhan, Zhaoyao, et al. "Photoresponse of multi-walled carbon nanotube-copper sulfide (MWNT-CuS) hybrid nanostructures." Physical Chemistry Chemical Physics 13.45 (2011): 20471-20475.

Olek, Maciej, et al. "Quantum dot modified multiwall carbon nanotubes." The Journal of Physical Chemistry B 110.26 (2006): 12901-12904.

Li, Xianglong, Yi Jia, and Anyuan Cao. "Tailored single-walled carbon nanotube—CdS nanoparticle hybrids for tunable optoelectronic devices." ACS nano 4.1 (2009): 506-512.

Shim, Moonsub, et al. "Polymer functionalization for air-stable n-type carbon nanotube field-effect transistors." Journal of the American Chemical Society 123.46 (2001): 11512-11513.

Ratanatawanate, C., et al, "S-Nitrosocystein-Decorated Pbs QDs/ti02 Nanotubes for Enhanced Production of Singlet Oxygen." Journal of the American Chemical Society 2011, 133; pp. 3492-3497.

Li, Yuebin, et al. "Copper sulfide nanoparticles for photothermal ablation of tumor cells." Nanomedicine 5.8 (2010): 1161-1171.

Wang, Xue-ying, Zhen Fang, and Xiu Lin. "Copper sulfide nanotubes: facile, large-scale synthesis, and application in photodegradation." Journal of Nanoparticle Research 11.3 (2009): 731-736.

Wu, Zhuangchun, et al. "Transparent, conductive carbon nanotube films." Science 305.5688 (2004): 1273-1276.

Salleh, Faiz, et al. "Seebeck coefficient of ultrathin silicon-on-insulator layers." Applied physics express 2.7 (2009): 071203.

Moon, Hye Kyung, Sang Ho Lee, and Hee Cheul Choi. "In vivo near-infrared mediated tumor destruction by photothermal effect of carbon nanotubes." ACS nano 3.11 (2009): 3707-3713.

Zhang, Y., and S. Iijima. "Elastic response of carbon nanotube bundles to visible light." Physical Review Letters 82.17 (1999): 3472.

Snyder, G. Jeffrey, and Eric S. Toberer. "Complex thermoelectric materials." Nature materials 7.2 (2008): 105-114.

Kind, Hannes, et al. "Nanowire ultraviolet photodetectors and optical switches." Advanced materials 14.2 (2002): 158.

Pradhan, Basudev, et al. "Carbon Nanotube—Polymer Nanocomposite Infrared Sensor." Nano letters 8.4 (2008): 1142-1146.

Itkis, Mikhail E., et al. "Bolometric infrared photoresponse of suspended single-walled carbon nanotube films." Science 312.5772 (2006): 413-416.

Yuan, Longyan, et al. "Self-cleaning flexible infrared nanosensor based on carbon nanoparticles." ACS nano 5.5 (2011): 4007-4013.

* cited by examiner

OPTICALLY AND THERMALLY RESPONSIVE NANOHYBRID MATERIALS

RELATED APPLICATION

This application claims the benefit of U.S. Provisional Application No. 61/776,342, filed Mar. 11, 2013, which is incorporated by reference.

FEDERALLY SPONSORED RESEARCH OR DEVELOPMENT

The U.S. Government may have certain rights in this disclosure. It was made with U.S. Government support under Grant No. NNX10AI40H, awarded by the National Aeronautics and Space Administration.

BACKGROUND

This disclosure generally relates to generating electricity from optically and/or thermally responsive materials.

SUMMARY

The following simplified summary provides a basic understanding of some aspects of the disclosed apparatus and methods. This summary is not an exhaustive overview. It is not intended to identify key or critical elements of the disclosed subject matter or to delineate the scope of the invention. Its sole purpose is to present some concepts in a simplified form as a prelude to the more detailed description that is discussed later.

In a first form, an apparatus for generating electricity comprises a generator. The generator may comprise: (i) single-walled Carbon nanotubes; (ii) Copper-Sulfur nanoparticles; and (iii) the single-walled Carbon nanotubes linked to the Cu—S nanoparticles. The ratio of Copper to Sulfur is not necessarily 1:1; in some forms the ratio between Copper and Sulfur may be 9:5 or more or less. In alternative forms, Copper-Selenide (CuSe) or Copper-Telluride (CuTe) may be substituted for CuS nanoparticles. In some forms, nanoparticles may be broadly construed to include nanowires, nanorods, nanosheets, and other nanostructures. In some forms, the single-walled Carbon nanotubes are non-covalently linked to the Cu—S nanoparticles. The apparatus may further comprise a first lead, a second lead, and/or a third lead. The first and second leads may be connected to the generator. The third lead may be connected to the second lead. Alternatively, the apparatus may further comprise: (i) a third lead connected to the second lead; and (ii) the third lead connected to the generator through the second lead only. In some forms, power generation may be maximized by having one lead made of a different material than one or more other leads. For example, the first and/or second and/or third leads may comprise a conductive material, such as Copper, Gold, Platinum, or other suitable conductor. Alternatively or in addition, the first or second lead may comprise a semiconductive material, such as Silicon or other suitable semiconductor. In some forms, the singled-walled Carbon nanotubes linked to the Cu—S nanoparticles form an N-type semiconductor and/or the lead comprising semiconductive material may be a P-type semiconductor. In alternative forms, the generator may be a P-type semiconductor and/or the lead comprising semiconductive material may be an N-type semiconductor.

In some forms, one or more parts or regions of the apparatus may have a different temperature than other parts or regions. In one form, the apparatus may be configured such that: (i) the first lead is connected to the generator at a first junction having a first temperature; (ii) the second lead is connected to the generator at a second junction having a second temperature; and (iii) the first temperature at the first junction is different than the second temperature at the second junction. In an alternative form, (i) a generator has a first temperature; (ii) a third lead is connected to a second lead at a junction having a second temperature; and (iii) the generator's first temperature is different than the junction's second temperature. Preferably, in either form, there will be a difference between the first temperature and the second temperature of at least 10 degrees Celsius, but the difference may be as little as 0.1 degrees or up to 20 degrees or greater.

In some forms, the apparatus may further comprise a source of electromagnetic radiation, such as sunlight or a lamp. In some forms, the lamp may be a source of infrared, visible, ultraviolet, X-ray, Beta-ray, and/or Gamma-ray, or a combination. In some forms, a source of thermal energy, e.g., steam, may be used in addition to or alternatively to a lamp. Preferably, the source of electromagnetic radiation is positioned to be directed at either the generator or a junction, and/or a shield may be positioned between the source and a junction. As a non-limiting example, the source of electromagnetic radiation may be directed at the generator and the shield may be positioned between the source and the junction. Alternatively, the source of electromagnetic radiation may be directed at the first junction and the shield positioned between the source and the second junction. In a further alternative, the source of electromagnetic radiation may be cast upon the entire apparatus and the shield positioned between the source and at least one junction. The shield preferably comprises a material substantially opaque to electromagnetic radiation having a wavelength between 100 and 1100 nanometers. Alternatively, the shield material is substantially opaque to electromagnetic radiation having a wavelength between 1000 and 100,000 nanometers. Alternatively, the shield material is substantially opaque in any sub-range between 100 and 100,000 nanometer wavelength electromagnetic radiation (as a non-limiting example, between 400 and 700 nanometers). A non-limiting example of a substantially opaque material has a transmittance within the relevant range of wavelengths that is, overall, less than 60%, or preferably less than 30%, or more preferably less than 10%, or most preferably less than 1% or less. Materials that may be substantially opaque at some electromagnetic wavelengths may not be substantially opaque at others. For example, a material that is substantially opaque between 100 and 1100 nanometers may not be substantially opaque at wavelengths of 10 nanometers or less.

Alternative forms of the apparatus may further comprise a substrate, wherein the generator is positioned on the substrate as a thin film. In some forms, the generator may consist essentially of the single-walled Carbon nanotubes linked to the Copper-Sulfur nanoparticles by a coordinating agent. Non-limiting examples of coordinating agents include oleylamine and other chemical ligands.

In a second form, an apparatus for generating electricity comprises at least two generators connected by at least one lead. The at least two generators may comprise: (i) single-walled Carbon nanotubes; (ii) Copper-Sulfur nanoparticles; and (iii) the single-walled Carbon nanotubes non-covalently linked to the Cu—S nanoparticles. As a non-limiting example, the apparatus may comprise three generators, only two of which comprise (i) single-walled Carbon nanotubes; (ii) Copper-Sulfur nanoparticles; and (iii) the single-walled Carbon nanotubes non-covalently linked to the Cu—S nanoparticles. In other forms, all generators may comprise at least (i) single-walled Carbon nanotubes; (ii) Copper-Sulfur nanoparticles; and (iii) the single-walled Carbon nanotubes non-covalently linked to the Cu—S nanoparticles. Preferably, the generators are connected in series and/or in parallel. In some forms, the generators are connected in series to increase output voltage. In some forms, the generators are connected in parallel to increase output current.

In a third form, a method of generating electricity comprises the steps of: (i) providing a generator having a first temperature, the generator comprising: single-walled Carbon nanotubes; Copper-Sulfur nanoparticles; and the single-walled Carbon nanotubes non-covalently linked to the Cu—S nanoparticles; (ii) providing: a first lead connected to the generator; a second lead connected to the generator; and a third lead connected to the second lead at a junction having a second temperature; (iii) increasing the generator's first temperature above the junction's second temperature; and (iv) generating an electrical potential across the first and third leads. In some forms, exposing the generator and/or the junction to a source of light and/or thermal radiation will increase the generator's temperature. As a non-limiting example, electricity may be generated either in the absence of abundant light if there is sufficient thermal radiation (e.g., on a warm but cloudy day) or in the absence of abundant thermal radiation if there is light (e.g., on a cold but sunny day). In either scenario, the generator will absorb more electromagnetic radiation than the junction. In some forms, exposing the generator to a light source alone will increase the generator's temperature. A preferably light source emits electromagnetic radiation within the ultraviolet to infrared ranges, e.g., e.g., 100-1000 nm. Alternatively, exposing the generator to a source of thermal energy, including without limitation steam or infrared radiation (e.g., 1000-100,000 nm), alone will increase the generator's first temperature. The relative difference in the generator's temperature to the junction's temperature may be increased by shielding the junction from either the light source or the source of thermal radiation. Moreover, the first, second, fourth, fifth, and/or six forms may also be employed in this third form, a method of generating electricity.

In a fourth form, a composition of matter comprises (i) single-walled Carbon nanotubes; (ii) Copper-Sulfur nanoparticles; and (iii) the single-walled Carbon nanotubes non-covalently linked to the Cu—S nanoparticles.

In a fifth form, an infrared sensor comprises a sensor comprising (i) single-walled Carbon nanotubes; (ii) Copper-Sulfur nanoparticles; and (iii) the single-walled Carbon nanotubes non-covalently linked to the Cu—S nanoparticles.

In a sixth form, an apparatus comprises a generator comprising and/or consisting essentially of: (i) Carbon nanotubes; (ii) Copper-Sulfur nanoparticles; and (iii) the Carbon nanotubes linked to the Cu—S nanoparticles.

In any of the foregoing forms, there is preferably no cooling or heat-sink component.

BRIEF DESCRIPTION OF THE DRAWINGS

For a further understanding of certain forms of the disclosed subject matter, reference should be made to the following description taken in conjunction with the accompanying drawings.

DESCRIPTION

Figure 1A:
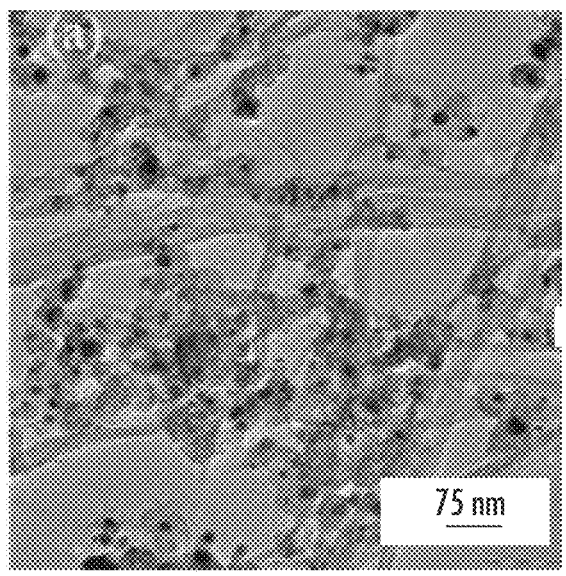
FIG. 1(a) shows a transmission electron microscopy image of a thin film of SWNT-CuS NPs. The legend shows a 75 nm scale.

Illustrative forms of the present subject matter are described below. In the interest of clarity, not all features of an actual implementation are described in this specification. It will be appreciated that in the development of any such actual form, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. The words and phrases used herein should be understood and interpreted to have a meaning consistent with the understanding of those words and phrases by those skilled in the relevant art. No special definition of a term or phrase—i.e., a definition that is different from the ordinary and customary meaning as understood by those skilled in the art—is intended to be implied by consistent usage of the term or phrase in this specification. To the extent that a term or phrase is intended to have a special meaning—i.e., a meaning other than that understood by skilled artisans—such a special definition will be expressly set forth in a definitional manner that directly and unequivocally provides the special definition for the term or phrase.

In this disclosure, "nanohybrid" means single-walled Carbon nanotubes non-covalently linked to Copper-Sulfur nanoparticles, preferably by oleylamine linkages ("SWNT-CuS NPs" or "CNT+CuS" for short). References to untreated Carbon nanotubes are abbreviated as SWNT or CNT, without adding "CuS."

Apparatus and methods of generating electricity include using an optically and thermally responsive material comprising SWNT-CuS NPs. SWNT-CuS NPs act as a thermoelectric generator lacking rectifying effects. In some forms, the generator may generate electricity from a light source alone, a heat source alone, or a source of both light and heat. Some forms exhibit enhanced optical and thermal switching characteristics, light absorption, photocurrent and thermocurrent generation under light illumination or/and thermal radiation, providing a new route to obtain thermoelectricity without any cooling or heat-sink component.

The following is a non-limiting example of how CuS NPs may be fabricated. An amount (e.g., 0.017048 g) of $CuCl_2 \cdot 2H_2O$ (Sigma-Aldrich, Inc.) may be dissolved within distilled water (e.g., 100 ml), followed by adding Thioglycolic acid ("TGA") (Sigma-Aldrich, Inc.) (e.g., about 0.2 mmol) under constant stirring. The solution's pH is preferably adjusted to 9.0, e.g., by adding a 1 M solution of NaOH. The solution may be degassed (e.g., for 20 min by argon bubbling or other suitable method), followed by adding a solution containing thioacetamide (Sigma-Aldrich, Inc.) (e.g., about 8.0 mg) in distilled water (e.g., 20 ml). One way to promote CuS nanoparticle growth is to heat the mixture at 50° C. for 2 hours.

In one form, oleylamine molecules link the CuS nanoparticles to the SWNTs. An amount of SWNT powder (Carbon Solutions, Inc.) (e.g., 10 mg) may be added to Toluene solution (Sigma-Aldrich, Inc.) (e.g., 100 mL) containing Oleylamine (Fluka, Sigma-Aldrich, Inc.) (e.g., 0.1% (v/v)). The mixture may be gently sonicated in a nitrogen atmosphere and then stirred overnight. Then the oleylamine-functionalized SWNTs may be isolated by centrifugation and rinsed with ethanol. The same amount of the functionalized SWNTs (e.g., 10 mg) may be dispersed in toluene (e.g., 100 mL) in three beakers, followed by adding solution of CuS nanoparticles with three different amounts (e.g., 100 μL, 200 μL, 300 μL) to the three beakers to obtain three types of nanohybrid materials. Each of the three mixtures may be gently sonicated (e.g., for 1.5 hours) at room temperature, and then the SWNT-CuS NPs may be precipitated by adding a small amount of methanol.

In some forms, thin films of both SWNT-CuS NPs and SWNT may be prepared on a mixed cellulose ester membrane using a vacuum filtration method. Each nanohybrid and SWNT suspension may be separately vacuum-filtered through a mixed cellulose ester filter (e.g., 47 mm in diameter). The resulting thin film on the filter may be rinsed twice with isopropyl alcohol and deionized water and then dried at 80° C. for 2 hours to help remove remaining organic residues in the film. After drying, the thin film sheet may be peeled off the filter or, alternatively, transferred onto a solid or flexible substrate.

Figure 1B:
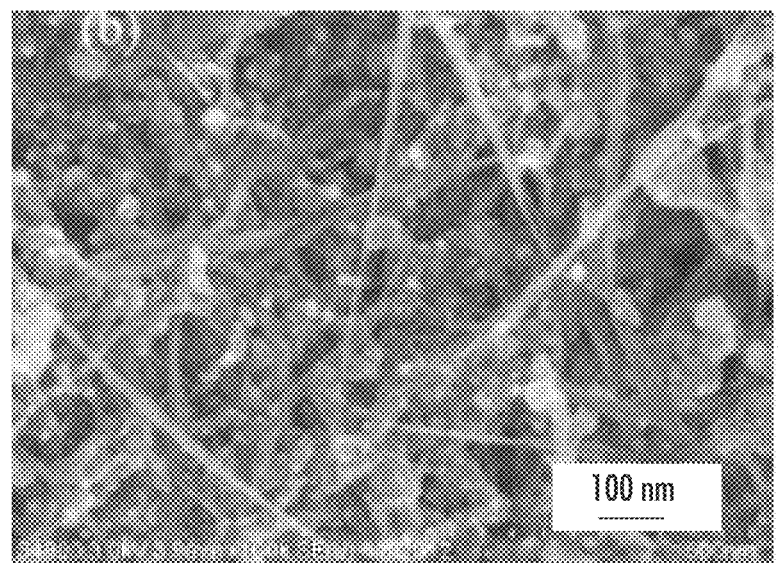
FIG. 1(b) shows a scanning electron microscopy image of a thin film of SWNT-CuS NPs. The legend shows a 100 nm scale.
Figure 1C:
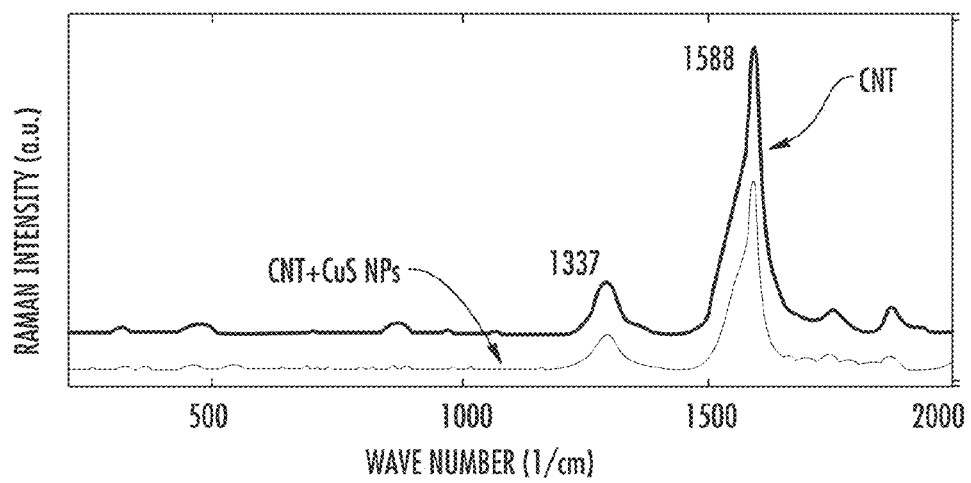
FIG. 1(c) shows Raman spectra of both SWNT-CuS NPs and SWNT thin films.

As shown in FIGS. 1(a) and 1(b), the surface morphology of SWNT-CuS NPs were characterized by a scanning electron micro scope (SEM, HITACHI S-4800) and a transmission electron microscope (TEM, ZEISS Libra 120). The images show that the CuS NPs are attached to SWNTs; hence, the SWNTs are "decorated" with CuS NPs. FIG. 1(c) shows Raman spectra of thin films of SWNT-CuS NPs and SWNT using a SENTERRA Raman Microscope (Bruker Optics, Inc.). The little difference between the spectra of the nanohybrids and untreated SWNT demonstrates that the electronic structure of SWNT remains essentially unchanged, and thus the electrical properties of the nanohybrids are similar to that of untreated SWNTs. It is theorized that the non-covalent bonds between the SWNT and CuS NPs in SWNT-CuS NPs account for the similarity between the electrical properties of SWNT-CuS NPs and untreated SWNTs. If instead the SWNT and CuS Nps were covalently bonded, however, there would be less electronic similarity between the hybrid material and untreated SWNTs, e.g., the material would have rectifying effects like those of a P-N semiconductor junction.

Figures 2A, 2B:
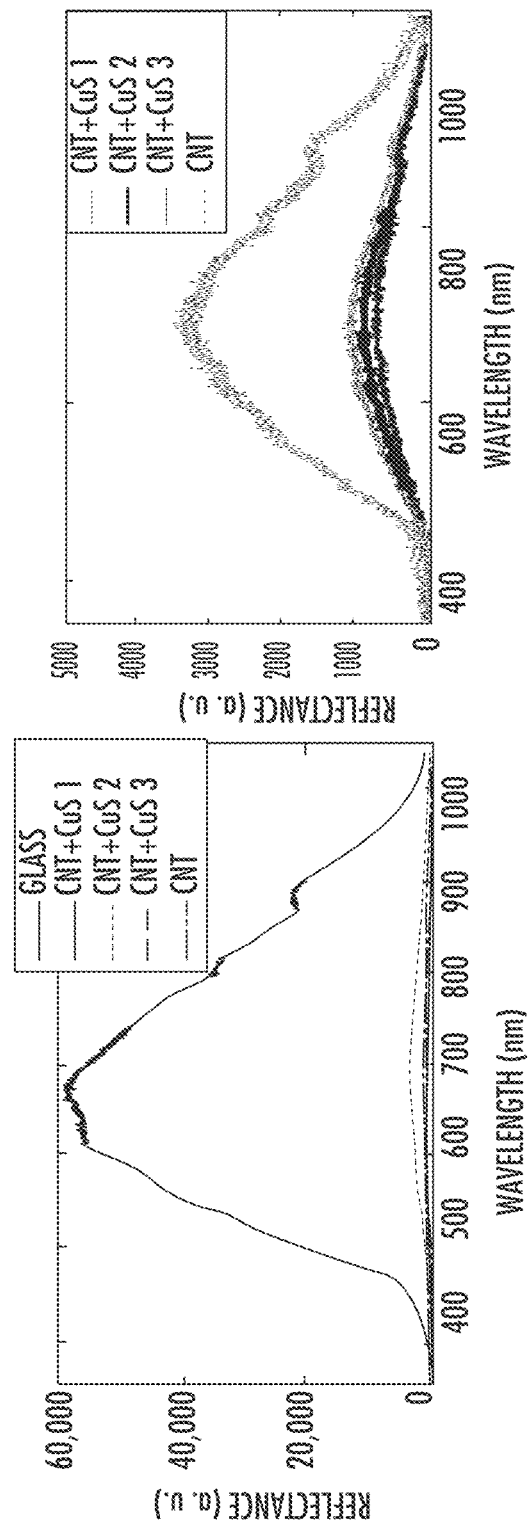
FIGS. 2(a) and (b) show reflectance measurements in the spectrum range from ultraviolet and visible light to near infrared.
Figure 2C:
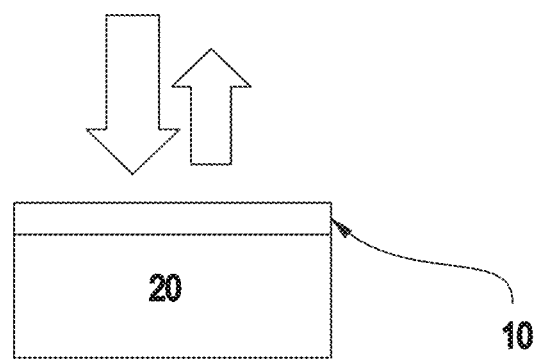
FIG. 2(c) shows the measurement setup for FIGS. 2(a) and 2(b), wherein the light illuminates perpendicularly to the thin film 10 upon a glass substrate 20 and the reflected light is measured.

Using the arrangement shown in FIG. 2(c), FIGS. 2(a) and 2(b) show reflectance measurements of a SWNT thin film and three SWNT-CuS NP thin films using an optic-fiber based reflectance measurement system (Ocean Optics, Inc.). The SWNT-CuS NP thin films were made by decorating SWNTs with three different amounts of CuS NPs: 10 mg SWNT decorated with 100 μl CuS NPs solution ("CNT+CuS 1"); 10 mg SWNT decorated with 200 μl CuS NPs solution ("CNT+CuS 2"); and 10 mg SWNT decorated with 300 μl CuS NPs solution ("CNT+CuS 3").

Using glass as a reference, FIG. 2(a) shows that the reflectance from the SWNT thin film and the nanohybrid thin films of the same thickness (25 μm) decreases tremendously—indicating the strong absorption—for visible and near infrared light. FIG. 2(b), showing the same data with a different vertical axis, shows that the reflectance further decreases—and thus the absorption of the light further increases—with the increased amount of the CuS NPs decorated with SWNTs compared to the untreated SWNTs. From most reflectance to least reflectance were glass, CNT, CNT+CuS1, CNT+CuS2, and, lastly, CNT+CuS3, having the least reflectance and hence most absorbance. It is theorized that the heat generated by the nanohybrids is due to the quantum effect of the CuS NPs and that the unique thermal properties of SWNTs are enhanced by them as compared to untreated SWNTs.

Figure 3A:
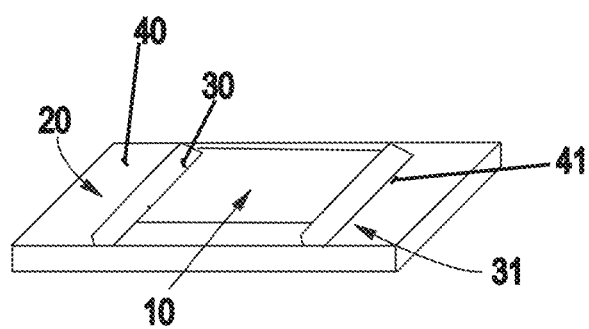
FIG. 3(a) shows a schematic of a SWNT-CuS NPs thin-film device (i.e., one form of an apparatus comprising a thermoelectric generator).
Figure 3B:
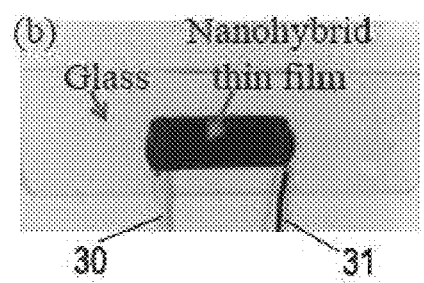
FIG. 3(b) shows a photograph of a SWNT-CuS NPs thin-film device on a glass substrate.
Figure 3C:
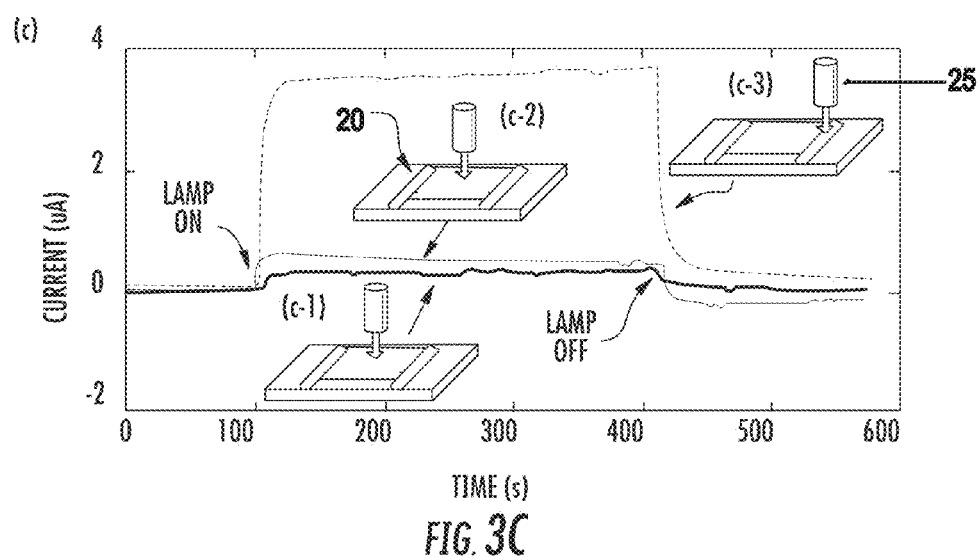
FIG. 3(c) shows a graph showing current as a function of time for three configurations of apparatuses comprising SWNT-CuS NPs.

Using the device shown in FIGS. 3(a) and 3(b), FIG. 3(c) shows a graph of current versus time for three configurations of the SWNT-CuS NPs thin-film device. FIGS. 3(a) and 3(b) show a first lead 30 and a second lead 31. FIG. 3(a) shows a device comprising a SWNT-CuS NPs thermoelectric generator 10 on a glass substrate 20 with two Copper leads 30,31 connected along two ends of the generator 10, forming two junctions 40,41 where the generator 10 and leads 30,31 connect. In one form, the thin film 10 with size of 1.5 cm (length)×1.0 cm (width)×25 μm (thickness) may be anchored on a glass substrate 20, with two ends of the thin film 10 connected with Cu wires 30,31 using Cu conductive glue as two electrodes (Anders Product, Inc). A lamp 25 (Olympus TL-2 incandescent lamp) may be positioned to illuminate different regions of the device. At approximately 100 s a lamp 25 was turned on, and shortly after approximately 400 s the lamp 25 was turned off. In all three configurations, the measured current was zero before the lamp 25 is turned on. The light intensity was 1.0 mW/mm$^2$ and thermal radiation (temperature change) was 17.6° C. for all the three experiments.

In the first and second configurations, measured at lines (c-1) and (c-2) in FIG. 3(c), the lamp 25 was positioned to illuminate the center of the device. In the first configuration, the current generated was stable at about 0.31 μA, measured using a digital multimeter (Agilent U1253B), and when the lamp 25 was turned off and removed, the current returned to zero. In the second configuration, measured at line (c-2) in FIG. 3(c), one electrode was covered by a 4 mm thick PDMS slab. PDMS is not substantially opaque to visible light. The generated current rose to about 0.50 μA after the lamp 25 was turned on, but the current eventually decreased and reached the same level as that of the device without the PDMS slab (i.e., the first configuration). This observed phenomenon suggests that the temperature at the electrode covered by a PDMS slab is slightly lower than that of the other electrode at the beginning when the lamp 25 is turned on, adding to the voltage generated by the nanohybrid thin film 10, resulting in an increased current (i.e., from 0.31 μA to 0.50 μA). After a certain time, however, as heat diffuses through the PDMS layer and reaches the electrode underneath, the temperature difference between the two electrodes 30,31 decreases.

In the third configuration, measured at line (c-3) in FIG. 3(c), the lamp 25 was positioned to illuminate one of the electrode regions of the device without applying a PDMS slab. This region was at a junction 41 between the film 10 and the Copper lead 31. The measured current was about 3.6 μA, which is about one order magnitude larger than that of the aforementioned cases (i.e., 0.31 μA), showing that asymmetric illumination enhances the current generation greatly, thereby improving the sensitivity of the nanohybrid thin-film devices. FIG. 3(c) shows that thin films of SWNT CuS NPs had significantly increased light absorption (up to 80%) compared to untreated SWNT thin films.

Figure 4A:
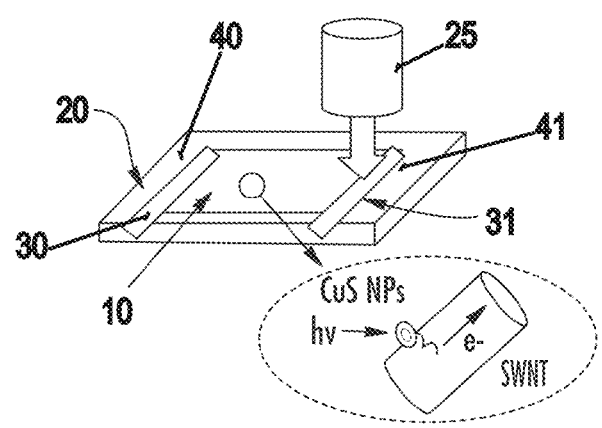
FIG. 4(a) shows a schematic of an asymmetrically illuminated SWNT-CuS NPs thin-film device (i.e., one form of an apparatus comprising a thermoelectric generator). The inset shows the electron creation and transfer from a CuS NP to a SWNT.

The asymmetric illumination shown in FIG. 4(a) was used for the measurements shown in FIGS. 4(b)-(d) and 5(a)-(d). FIG. 4(a) shows a first lead 30 and a second lead 31. A source of light and/or thermal radiation 25 was directed at the junction 41 between SWNT-CuS NPs thin-film 10 and a Copper lead 31. The SWNT-CuS NPs 10 and two Copper leads 30,31 were positioned on a glass substrate 10. Data shown in FIGS. 4(b)-(d) was measured using a cold light source 25 (XD-301 series 150 watt haloid lamp) with light intensity of 0.57 mW/mm$^2$, measured using a CCD optical power meter (Thorlabs PM100), and thermal radiation (temperature change) of 2.4° C., measured using a thermocouple (Omega HH306). Data shown in FIGS. 5(a)-(c) was measured using a lamp 25 covered with Aluminum foil, which is substantially opaque to visible light but not for infrared thermal radiation, with thermal radiation (temperature change) of 18.0° C.

Figure 4B:
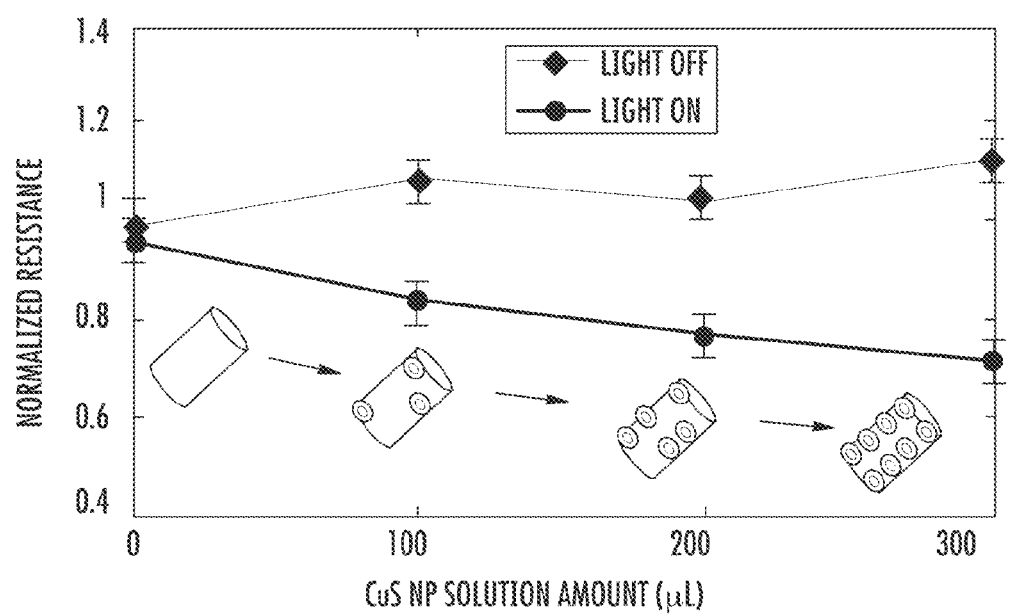
FIG. 4(b) shows I-V curves of SWNT and SWNT-CuS NPs thin-film devices under a cold light (i.e., without heat) turned on and off. The devices were asymmetrically illuminated according in the configuration shown in FIG. 4(a).
Figure 5A:
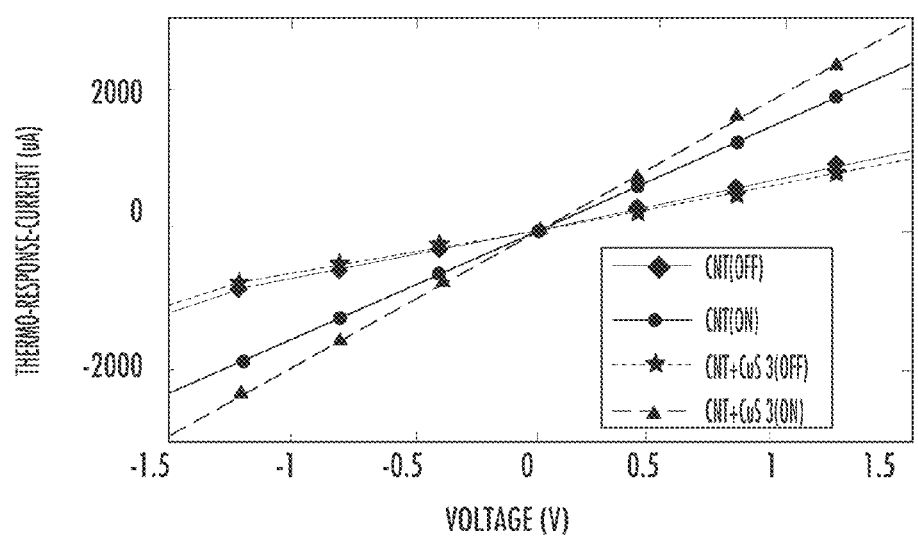
FIG. 5(a) shows I-V curves of SWNT and SWNT-CuS thin-film devices under heat only (i.e., without visible light) turned on and off. The devices were asymmetrically illuminated according in the configuration shown in FIG. 4(a).

FIGS. 4(b) and 5(a) measure the nanohybrid's photoresponse and thermo-response, respectively. The slope of the I-V curves, measured using a Keithley measurement station, show conductivity (i.e., the inverse of resistivity), and in both experiments, in the order of least conductive to most conductive, the devices were: the SWNT-CuS NPs with source 25 off; the CNT with source 25 off; the CNT with source 25 on; and, lastly, the SWNT-CuS NPs with source 25 on, which was the most conductive and hence exhibited the least resistance. The increased resistance of the SWNT-CuS NPs when light and heat sources are absent and the markedly decreased resistance when a light and/or heat source is present makes this novel material ideal for light, temperature, and/or infrared sensing applications.

FIG. 4(b) shows photocurrent measurements of the nanohybrid and SWNT thin-film devices using a cold light source, which minimized thermal radiation. With excellent repeatability, the I-V slope increased when the light source 25 was turned on and returned to its original slope when the light source 25 was turned off. For the untreated SWNT thin-film device, the conductivity change before and after turning on the light 25 was quite small at about 4.3%, while the changes for the nanohybrid thin-film devices were much larger in the range of 28.7 to 57.2%. It is theorized that, upon light illumination, excitons (electron and hole pairs) are generated in CuS NPs and SWNTs. While the holes would remain in the CuS NPs, the electrons will transfer to SWNTs. As a result, enhanced photocurrent is generated and the enhanced conductivity of the nanohybrid material, acting as an N-type semiconductor, is achieved.

FIG. 5(a) shows thermo-current measurements of nanohybrid and SWNT thin-film devices using a lamp 25 covered in Al foil, which minimized visible light. As compared to the photoresponse shown in FIG. 4(b), the conductivity change from exposure to the heat source was much larger, about 90.5% greater for SWNT and from ~110.2% to ~166.3% greater for nanohybrids. For example, under light illumination, the resistance change of SWNT thin-film device was only about 4.3%, but the change was about 47.5% under thermal illumination. The even greater increase for the nanohybrid devices demonstrates that the optical sensitivity of SWNT thin-film devices can be improved dramatically by attaching CuS NPs to SWNTs.

Figure 4C:
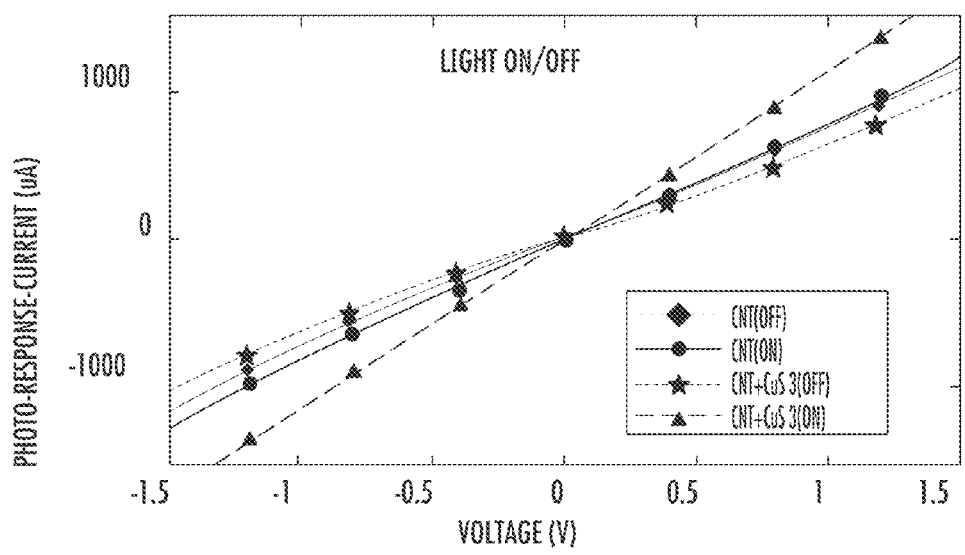
FIG. 4(c) shows modulated resistance (normalized to the resistance of the untreated SWNT thin-film device) for SWNT-CuS NPs with different amounts of CuS NPs under a cold light (i.e., without heat) turned on and off. The four insets show SWNTs with increasing amounts of CuS NPs decoration. The devices were asymmetrically illuminated according in the configuration shown in FIG. 4(a).
Figure 5B:
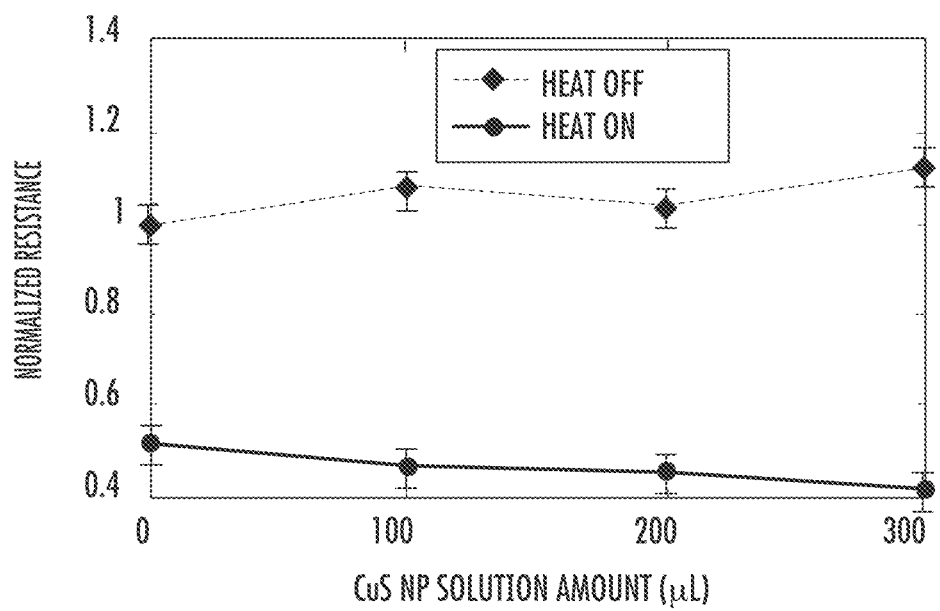
FIG. 5(b) shows modulated resistance (normalized to the resistance of the untreated SWNT thin-film device) for SWNT-CuS NPs with different amounts of CuS NPs under heat only (i.e., without visible light) turned on and off. The devices were asymmetrically illuminated according in the configuration shown in FIG. 4(a).

FIGS. 4(c) and 5(b) show the modulated resistance for nanohybrids with different amounts of CuS NPs using a cold light and heat source, respectively. In all cases, the thin-film devices were less conductive when the light or heat source was absent and more conductive when the light or heat source was present. FIG. 4(c) shows that, while under light illumination, resistance further decreases if the amount of CuS NPs decorated with SWNTs increases. In other words, SWNTs decorated with increasingly more CuS NPs showed increasingly larger conductivity when exposed to light. FIG. 5(b) shows a similar phenomenon, but to a much greater degree, with respect to thermal illumination. It appears that resistance of nanohybrid thin-film devices decreases dramatically when the heat is turned on, and the resistance of the nanohybrid thin-film devices further decreases with increased amounts of CuS NPs. For example, whereas SWNTs treated with 200 µL CuS NP solution showed an 4.3% increase in conductivity upon exposure to a cold light, the same nanohybrid material showed a 47.5% increase in conductivity from thermal illumination.

Figure 4D:
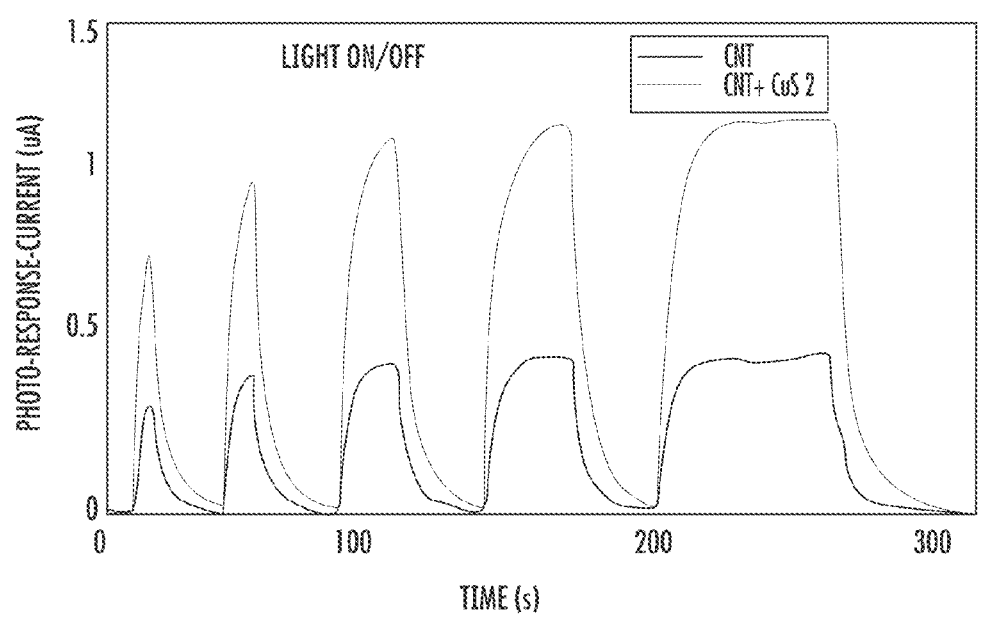
FIG. 4(d) shows modulated photo-current for a SWNT-CuS NPs thin-film device made with CNT+CuS 2 (10 mg SWNT decorated with 200 µL CuS NPs solution) under a cold light (i.e., without heat) turned on and off. For reference, also shown are data for an untreated SWNT thin-film device. The devices were asymmetrically illuminated according in the configuration shown in FIG. 4(a).
Figure 5C:
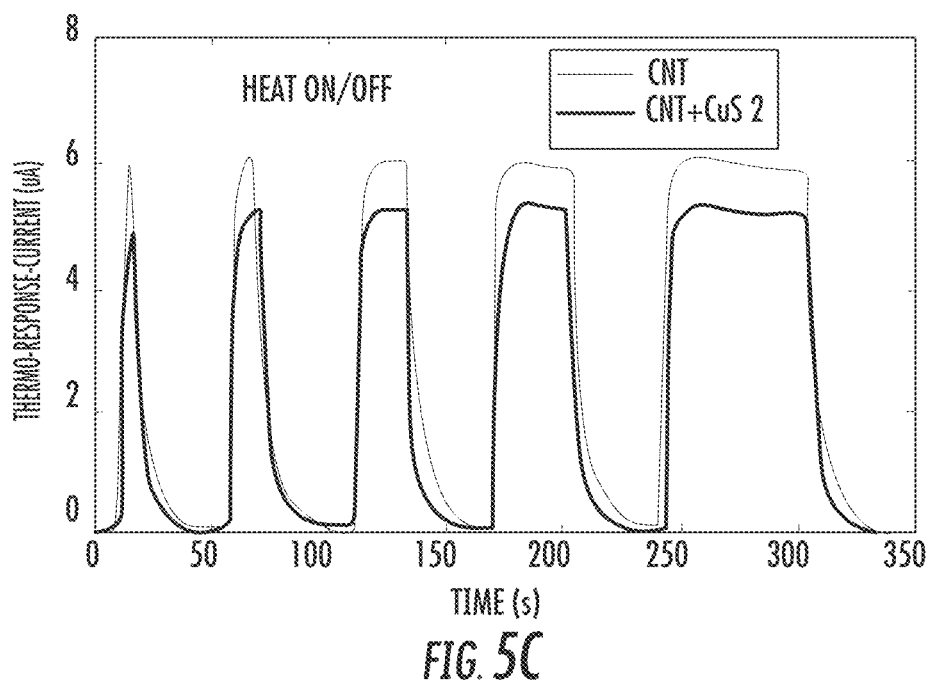
FIG. 5(c) shows modulated thermo-current for a SWNT-CuS NPs thin-film device made with 10 mg SWNT decorated with 200 µL CuS NPs solution ("CNT+CuS 2") under heat only (i.e., without visible light) turned on and off. For reference, also shown are data for an untreated SWNT thin-film device. The devices were asymmetrically illuminated according in the configuration shown in FIG. 4(a).
Figure 5D:
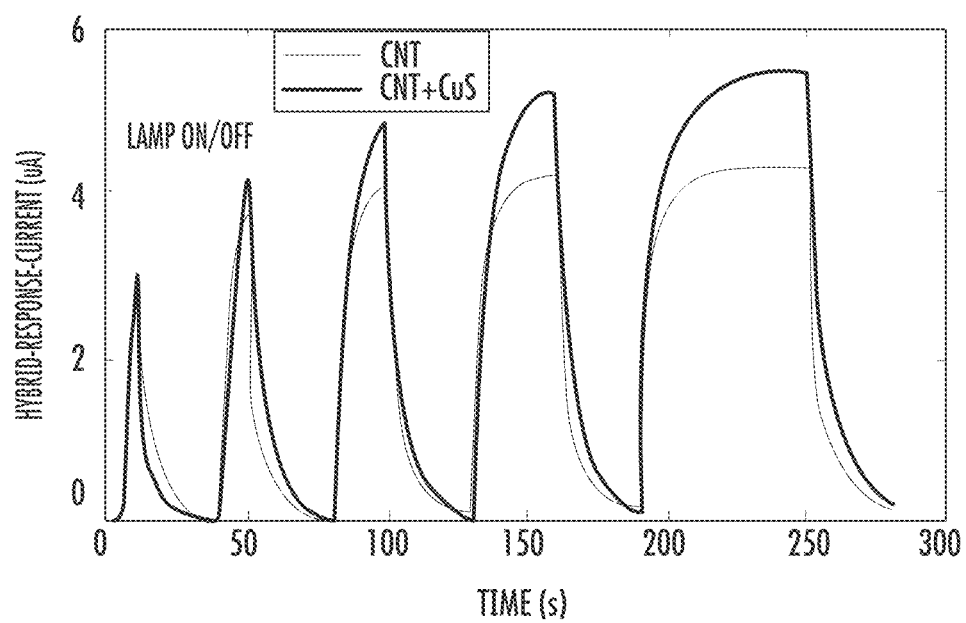
FIG. 5(d) shows modulated photo-thermo-current for the nanohybrid thin-film device made with 10 mg SWNT decorated with 200 µL CuS NPs solution ("CNT+CuS 2") under a lamp (light+heat) turned on and off. For reference, also shown are data for an untreated SWNT thin-film device. The devices were asymmetrically illuminated according in the configuration shown in FIG. 4(a).

FIGS. 4(d), 5(c), and 5(d) show measurements of the nanohybrid material's photoresponse, thermo-response, and photo-thermo-response, respectively. In each case, the current generated by the SWNT-CuS NPs device was greater than untreated SWNT in response to electromagnetic stimulation. These graphs demonstrate that SWNT-CuS NPs have optical and/or thermal switching effects. In these measurements, no voltage was applied on the thin-film device and the light and/or heat source 25 was turned on and off periodically with varied durations.

Figure 6A:
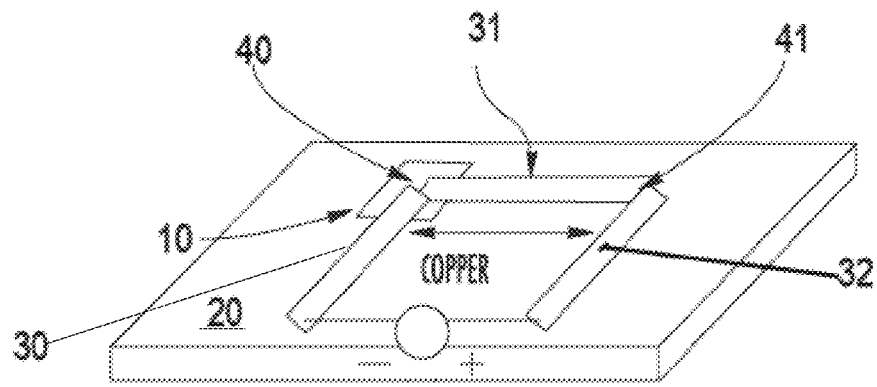
FIG. 6(a) shows a schematic of one form of a SWNT-CuS NPs thermoelectric generator.
Figure 6E:
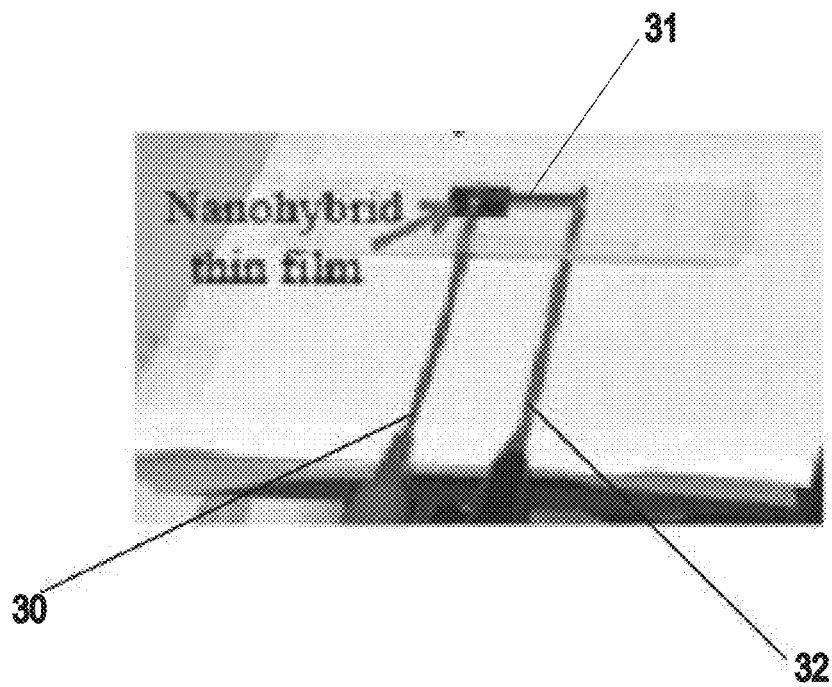
FIG. 6(e) shows a photograph of the device shown in FIG. 6(a).

The photograph and schematic shown in FIGS. 6(a) and 6(e) depict one form of a device comprising a SWNT-CuS NPs thermoelectric generator. FIGS. 6(a) and 6(e) show a first lead 30, a second lead 31, and a third lead 32. The device comprises a glass substrate 20 and a generator 10 comprising a 25 µm thin film of SWNT-CuS NPs (CNT+CuS 2). The generator 10 is connected to a first Copper lead 30 and a Silicon lead 31, diced from a boron doped, P-type silicon wafer with 500 µm thickness, and the ends of the leads 30,31 were embedded in the SWNT-CuS NPs thin film 10. In one form, the first Copper lead 30 and the Silicon lead 31 are connected directly and the film 10 is attached to the junction 40. A second end of the Silicon lead 31 may be connected to a second Copper lead 32 using Copper conductive glue (Anders Product, Inc). While the Silicon in the given example was doped with Boron, other semiconductors may be used in alternative forms of the device. The first Copper lead 30 is connected to the Silicon lead 31 and the SWNT-CuS NPs generator 10 at a first junction 40, "Junction I," and the second Copper lead 32 is connected to the Silicon lead 31 at a second junction, "Junction II." A voltage was measured across the Copper leads 30,32 based on the temperature difference between the junctions 40, 41 and the difference between the Seebeck coefficient of the leads (Silicon: ~300 µV/K, Copper: ~1.84 µV/K).

Figure 6B:
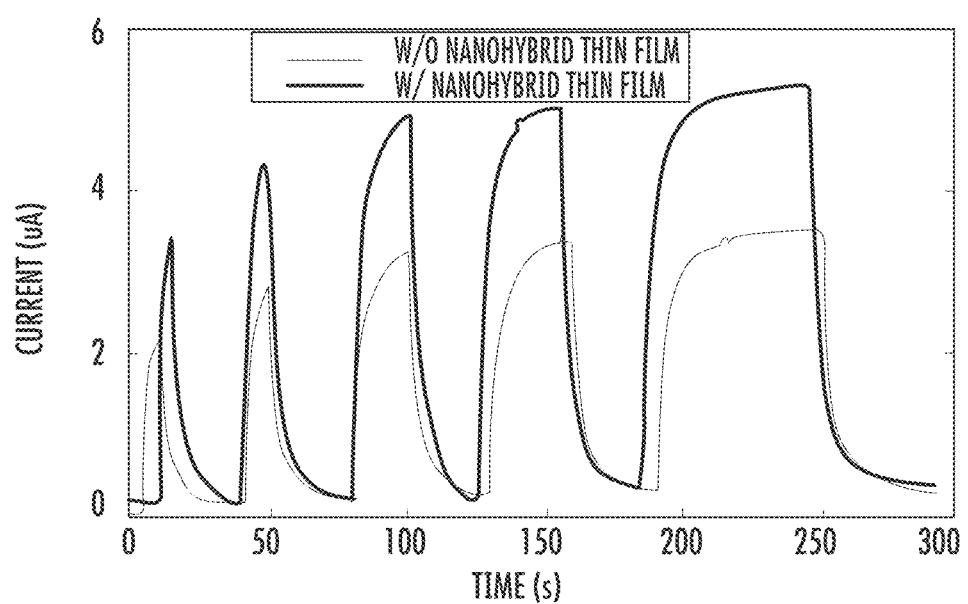
FIG. 6(b) shows current measured when the lamp (light+heat) illuminates the Junction I region of the device shown in FIG. 6(a), with and without SWNT-CuS NPs thin film.

FIG. 6(b) shows current measurements for devices with and without the SWNT-CuS NPs thin film under a lamp 25 (light+heat) directed at Junction I 40. In the nanohybrid device, one junction 40 between Cu and Si leads 30,31 was embedded in a SWNT-CuS thin film 10 and the other junction 41 was exposed to the air; in the non-nanohybrid device, both junctions 40,41 were exposed to the air. Both devices generated currents, but the current was significantly larger for the device with the integrated nanohybrid in Junction I 40 region than the one without the nanohybrid material.

Figure 6C:
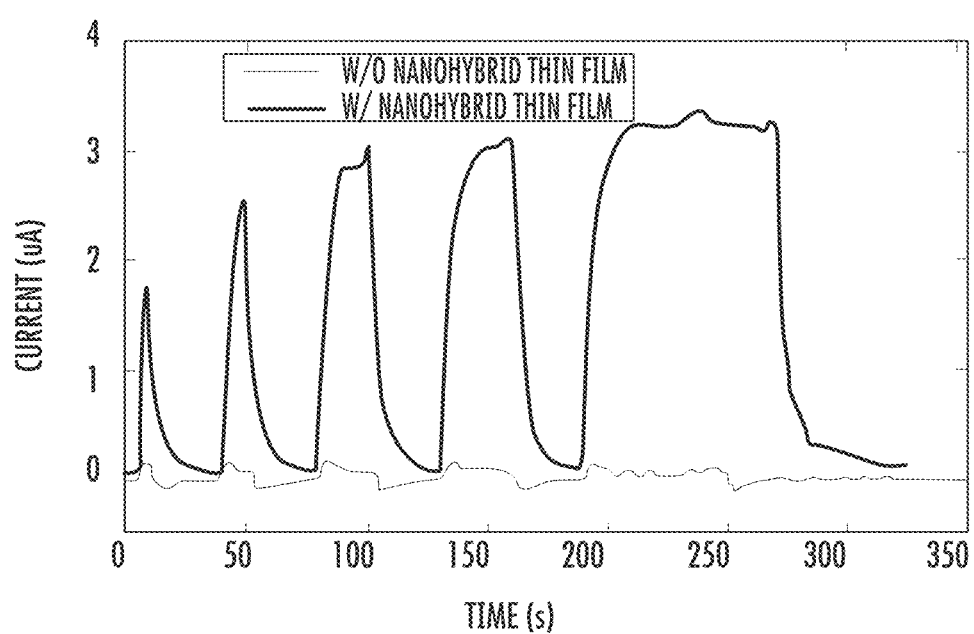
FIG. 6(c) shows current measured when the lamp (light+heat) uniformly illuminates the device shown in FIG. 6(a), with and without SWNT-CuS NPs thin film.

FIG. 6(c) shows the same experiment as FIG. 6(b), but with the devices under a lamp 25 (light+heat) illuminating the whole device. The device with integrated nanohybrids generated much more current than the device without nanohybrids, which had almost negligible current generation. This difference in each devices' current generation is probably due to the nanohybrid material's significant thermoresponse and photoresponse, increasing the temperature difference between Junctions I and II 40,41, whereas the temperature difference in the device without the nanohybrid material was close to zero.

Figure 6D:
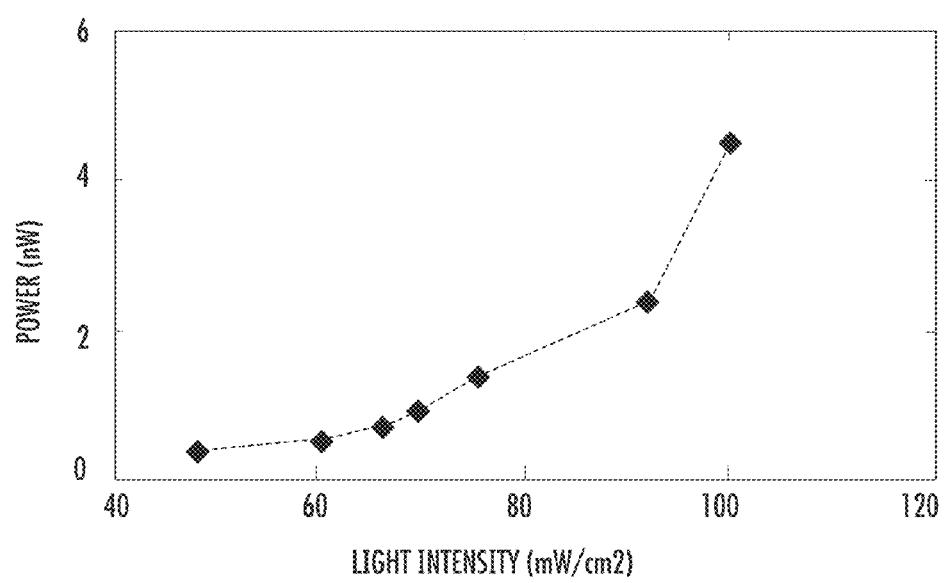
FIG. 6(d) shows power generation for the device shown in FIG. 6(a) with SWNT-CuS NPs thin film.

FIG. 6(d) shows power generated by the nanohybrid device. By cascading a series of these devices, the power can be scaled up to the range of micro-watts or even milli-watts. This technical demonstration indicates that a new design for thermoelectric generators requiring no heat-sink or cooling components, because the temperature difference across junctions may be formed and maintained by integrated nanohybrid materials.

The following disclosures are hereby incorporated by reference: Yi-Hsuan Tseng et al 2012 Nanotechnology 23 455708; Z. Gong, Y. He, A. Tseng, C. O'Neal, and L. Que, Nanotechnology, 23, 335401 (2012); V. Kotipalli, Z. Gong, P. Pathak, T. Zhang, Y. He, S. Yadav, and L. Que, Appl. Phys. Lett. 97, 124102 (2010); Z. Gong, A. Tseng, Y. He, and L. Que, J. Nanoscience and Nanotechnology, 12(1), 350 (2012); D. Eder, Chem. Rev., 110, 1348 (2010); J. Chen, M. Hamon, H. Hu, Y. Chen, A. Rao, P. Ecklund, and R. Haddon, Science, 282, 95 (1998); J. Zhang, J. Yu, Y. Zhang, Q. Li, and J. Gong, Nano Lett. 11, 4774 (2011); M. Lee, and K. Young, Nanotechnology, 23, 1940141 (2012); Z. Zhan, C. Liu, L. Zheng, G. Sun, B. Li, and Q. Zhang, Phys. Chem. Chem. Phys., 31, 20471 (2011); M. Olek, T. Busgen, M. Hilgendorff, and M. Giersig, J. Phys. Chem. B, 110, 12901 (2006); X. Li, Y. Jia, and A. Cao, ACS Nano, 4 (1), 506 (2010); M. Shim, A. Javey, N. Kam, and H. Dai, J. Am. Chem. Soc, 123, 11512 (2001); C. Ratanatawanate, A. Chyao, and K. Balkus, J. Am. Chem. Soc. 133, 3492 (2011); L. Yang, S. Luo, R. Liu, Q. Cai, Y. Xiao, S. Liu, F. Su, and L. Wen, J. Phys. Chem. C, 114, 783 (2010); Y. Li, W. Liu, Q. Huang, M. Huang, C. Li, and W. Chen, Nanomedicine, 5(8), 1161(2010); S. Lakshmanan, X. Zou, M. Hossu, L. Ma, C. Yang, and W. Chen, J. Biomed. Nanotechnol. 8, 883-890 (2012); S. Kasap, Principles of Electronic Materials and Devices (McGraw-Hill Science/Engineering/Math, 2005); X. Wang, Z. Fang, and X. Lin, J. Nanopart. Res. 11, 731 (2009); Z. Wu, Z. Chen, X. Du, J. Logan, J. Sippel, M. Nikolou, K. Kamaras, J. Reynolds, D. Tanner, A. Hebard, and A. Rinzler, Science, 305, 1273(2004); F. Salleh, K. Asai, A. Ishida, and H. Ikeda, Appl. Phys. Exp., 2, 071203 (2009); N. Zeng, and A. Murphy, Nanotechnology, 20, 3757021 (2009); H. Moon, S. Lee, and H. Choi, ACS Nano, 3 (11), 3707 (2009); Y. Zhang, and S. Iijima, Physical Review Letters, 82, 3472 (1999); G. J. Snyder, and E. S. Toberer, Nature Materials, 7, 105 (2008); H. Kind, H. Yan, B. Messer, M. Law, and P. Yang, Adv. Mater. 14, 158 (2002); B. Pradhan, K. Setyowati, H. Liu, D. Waldeck, and J. Chen, Nano Lett., 8(4), 1142 (2008); M. Itkis, F. Borondics, A. Yu, and R. Haddon, Science, 312, 413 (2006); L. Yuan, J. Dai, X. Fan, T. Song, Y. Tao, K. Wang, Z. Xu, J. Zhang, X. Bai, P. Lu, J. Chen, J. Zhou, and Z. Wang, ACS Nano, 5(5), 4007 (2011); and G. J. Snyder, Thermoelectric power generation: efficiency and compatibility, in Thermoelectrics Handbook Macro to Nano, edited by D. M. Rowe (CRC, Boca Raton, 2006), Ch. 9.

The scope of the invention shall be solely defined by the claims and their equivalents; the foregoing description of certain forms of the disclosed subject matter has been presented for purposes of illustration and description only. The apparatuses and methods shown in the drawings and described above are exemplary of numerous forms that may be made within the scope of the claims. The forms were chosen and described to explain the principles of the disclosed subject matter and its practical application to enable one skilled in the art to utilize the disclosed subject matter in various forms and with various modifications as are suited to the particular use contemplated. The described forms are not intended to be exhaustive or to limit the invention to the precise forms described. Indeed, the described forms may be modified and practiced in different but equivalent manners apparent to those skilled in the art having the benefit of this disclosure. For example, the process steps set forth above may be performed in a different order. Other modifications and variations are possible in light of this disclosure's teachings and from the benefit of practicing the disclosed subject matter. Accordingly, the particular forms described above may be altered or modified and all such variations are considered within the scope and spirit of the claimed invention.

What is claimed is:
1. An apparatus for generating electricity comprising:
   a. a thermoelectric generator comprising:
      i. single-walled carbon nanotubes;
      ii. carbon-sulfur nanoparticles;
      iii. the single-walled carbon nanotubes linked to the copper-sulfur nanoparticles; and
   b. at least a first lead and a second lead connected to the generator.
2. The apparatus of claim 1, further comprising:
   a. the first lead comprises a conductive material; and
   b. the second lead comprises a semiconductive material.
3. The apparatus of claim 2, wherein:
   a. the singled-walled carbon nanotubes linked to the copper-sulfur nanoparticles form an N-type semiconductor; and
   b. the second lead is a P-type semiconductor.
4. The apparatus of claim 1, wherein:
   a. the first lead is connected to the generator at a first junction having a first temperature;
   b. the second lead is connected to the generator at a second junction having a second temperature; and
   c. the first temperature at the first junction is different than the second temperature at the second junction.
5. The apparatus of claim 1, wherein the single-walled carbon nanotubes are non-covalently linked to the carbon-sulfur nanoparticles.
6. The apparatus of claim 4, further comprising a source of electromagnetic radiation.
7. The apparatus of claim 6, further comprising the source of electromagnetic radiation directed at the first junction.
8. The apparatus of claim 6, further comprising:
   a. a shield between the source and the second junction; and
   b. the shield comprising a material substantially opaque to electromagnetic radiation having a wavelength between about 100 and about 1100 nanometers.
9. The apparatus of claim 1, further comprising a third lead connected to the second lead.
10. The apparatus of claim 2, further comprising:
   a. a third lead connected to the second lead;
   b. the third lead is connected to the generator through the second lead only; and
   c. the third lead comprising a conductive material.
11. The apparatus of claim 1, wherein:
   a. the generator having a first temperature;
   b. a third lead connected to the second lead at a junction having a second temperature; and
   c. the generator's first temperature is different than the junction's second temperature.

12. The apparatus of claim 1, wherein the apparatus does not comprise a cooling or heat-sink component.
13. The apparatus of claim 11, further comprising a source of electromagnetic radiation.
14. The apparatus of claim 13, further comprising the source of electromagnetic radiation directed at the generator.
15. The apparatus of claim 13, further comprising:
   a. a shield between the source and the junction; and
   b. the shield comprising a material substantially opaque to electromagnetic radiation having a wavelength between 100 and 1100 nanometers.
16. The apparatus of claim 1, further comprising:
   a. a substrate; and
   b. the generator positioned on the substrate as a thin film.
17. The apparatus of claim 1, wherein the generator consists essentially of the single-walled carbon nanotubes linked to the copper-sulfur nanoparticles by a coordinating agent.
18. An apparatus for generating electricity comprising:
   a. at least two thermoelectric generators, the generators comprising:
      i. single-walled carbon nanotubes;
      ii. copper-sulfur nanoparticles; and
      iii. a direct, non-covalent link from the single-walled carbon nanotubes to the copper-sulfur nanoparticles; and
   b. at least one lead connecting the at least two generators.
19. A method of generating electricity comprising the steps of:
   a. providing a thermoelectric generator having a first temperature, the generator comprising:
      i. single-walled carbon nanotubes;
      ii. copper-sulfur nanoparticles; and
      iii. the single-walled carbon nanotubes non-covalently linked to the copper-sulfur nanoparticles;
   b. providing: a first lead connected to the generator; a second lead connected to the generator; and a third lead connected to the second lead at a junction having a second temperature;
   c. increasing the generator's first temperature above the junction's second temperature; and
   d. generating an electrical potential across the first and third leads.
20. The method of claim 19, further comprising increasing the generator's first temperature by exposing the generator and the junction to a source of light and/or thermal radiation.
21. The method of claim 19, further comprising increasing the generator's first temperature by exposing the generator to a light source.
22. The method of claim 21, further comprising shielding the junction from the light source.
23. The method of claim 19, further comprising increasing the generator's first temperature by exposing the generator to a source of thermal energy.
24. The method of claim 23, further comprising shielding the junction from the light source.
25. The apparatus of claim 4, wherein a difference between the first temperature and the second temperature is at least 0.1 degrees Celsius.
26. The apparatus of claim 25, wherein the difference between the first temperature and the second temperature is at least 10 degrees Celsius.
27. The apparatus of claim 11, wherein a difference between the first temperature and the second temperature is at least 0.1 degrees Celsius.

28. The apparatus of claim 27, wherein the difference between the first temperature and the second temperature is at least 10 degrees Celsius.

29. The method of claim 19, wherein a difference between the first temperature and the second temperature is at least 0.1 degrees Celsius.

30. The method of claim 29, wherein the difference between the first temperature and the second temperature is at least 10 degrees Celsius.

31. The apparatus of claim 4, wherein the first junction and the second junction are configured to have an electric current when the first temperature at the first junction is different than the second temperature at the second junction.

32. The apparatus of claim 11, wherein the generator and junction are configured to have an electric current when the generator's first temperature is different than the junction's second temperature.

33. The method of claim 19, wherein the generator and junction are configured to have an electric current when the generator's first temperature is different than the junction's second temperature.

\* \* \* \* \*